(12) United States Patent
Saito et al.

(10) Patent No.: US 11,746,035 B2
(45) Date of Patent: Sep. 5, 2023

(54) MANUFACTURING METHOD AND MANUFACTURING DEVICE OF GLASS ROLL

(71) Applicant: Nippon Electric Glass Co., Ltd., Shiga (JP)

(72) Inventors: Takayoshi Saito, Shiga (JP); Hiroki Mori, Shiga (JP); Riku Yamashiro, Shiga (JP); Naotoshi Inayama, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 149 days.

(21) Appl. No.: 17/615,204

(22) PCT Filed: Jun. 25, 2020

(86) PCT No.: PCT/JP2020/025007
§ 371 (c)(1),
(2) Date: Nov. 30, 2021

(87) PCT Pub. No.: WO2021/006054
PCT Pub. Date: Jan. 14, 2021

(65) Prior Publication Data
US 2022/0227655 A1 Jul. 21, 2022

(30) Foreign Application Priority Data
Jul. 11, 2019 (JP) .................................. 2019-129201

(51) Int. Cl.
*C03B 35/16* (2006.01)

(52) U.S. Cl.
CPC .......... *C03B 35/165* (2013.01); *C03B 35/162* (2013.01)

(58) Field of Classification Search
CPC ........................... C03B 35/162; C03B 35/165
See application file for complete search history.

(56) References Cited

U.S. PATENT DOCUMENTS

| 9,028,940 | B2 * | 5/2015 | Hasegawa | ............. | B65H 21/00 |
| | | | | | 206/413 |
| 9,724,890 | B2 * | 8/2017 | Murashige | ............. | B32B 15/08 |
| 2013/0134202 | A1 | 5/2013 | Garner et al. | | |

(Continued)

FOREIGN PATENT DOCUMENTS

| JP | 2012-001405 | 1/2012 |
| JP | 2014-043326 | 3/2014 |
| JP | 2017-109850 | 6/2017 |

(Continued)

OTHER PUBLICATIONS

International Preliminary Report on Patentability and Written Opinion of the International Searching Authority dated Jan. 11, 2022 in International (PCT) Application No. PCT/JP2020/025007.

(Continued)

*Primary Examiner* — Cynthia Szewczyk
(74) *Attorney, Agent, or Firm* — Wenderoth, Lind & Ponack, L.L.P.

(57) ABSTRACT

In a manufacturing method of a glass roll, a transport device transports a glass film coupled to lead films via coupling portions. The transport device separates the lead films and/or the coupling portions from a heating roller when the lead films and/or the coupling portions pass by the heating roller.

9 Claims, 13 Drawing Sheets

(56) References Cited

U.S. PATENT DOCUMENTS

2015/0246787 A1    9/2015   Tamagaki et al.
2016/0185545 A1    6/2016   Garner et al.

FOREIGN PATENT DOCUMENTS

| | | | |
|---|---|---|---|
| JP | 2017-222516 | 12/2017 | |
| JP | 2018-188320 | 11/2018 | |
| WO | WO-2010038761 A1 * | 4/2010 | ........... B32B 17/064 |
| WO | 2015/125512 | 8/2015 | |

OTHER PUBLICATIONS

International Search Report dated Sep. 8, 2020 in International (PCT) Application No. PCT/JP2020/025007.

* cited by examiner

MANUFACTURING METHOD AND MANUFACTURING DEVICE OF GLASS ROLL

TECHNICAL FIELD

The present invention relates to a method and a device for manufacturing a glass roll by winding a glass film on which a functional film is formed.

BACKGROUND ART

There have been known techniques for forming a functional film on a glass film while unwinding the glass film from a base glass roll and transporting the glass film in a predetermined direction using a roll-to-roll method.

For example, Patent Document 1 discloses a manufacturing method of a glass roll, the method including a glass film supply step of feeding a first glass film unwound from a base glass roll in a predetermined direction, a film formation step of forming a functional film (transparent conductive film) with heat on the first glass film to form a second glass film, a protective film supply step of layering a protective film on the second glass film to form a third glass film, and a winding step of winding the third glass film into a roll shape to form the glass roll.

When the glass film (third glass film) on which the functional film is formed is wound into the roll shape as described above, the glass film needs to be coupled to a winding core. Patent Document 2, for example, discloses a technique of coupling the winding core and the glass film by using a resin lead film (leader) to prevent damage to the glass film.

CITATION LIST

Patent Literature

Patent Document 1: JP 2018-188320 A
Patent Document 2: JP 2017-109850 A

SUMMARY OF INVENTION

Technical Problem

When the functional film is formed on the glass film by the roll-to-roll method as in the related art, since the resin lead film has a heat resistance lower than that of the glass film, there is a possibility of deformation or breakage of the resin lead film due to heat emitted from the film formation device when transitioning through the film formation step. Further, since the glass film and the lead film are coupled by an adhesive tape or the like, an adhesive component or the like of the adhesive tape may be altered by the heat emitted from the film formation device, causing the glass film and the lead film to separate at the coupling portion.

In light of the circumstances described above, the technical problem addressed by the present invention is to form a film with heat on a glass film without causing deformation or breakage of a lead film. Further, the technical problem addressed by the present invention is to form a film with heat on a glass film without causing separation of a lead film and a glass film at a coupling portion.

Solution to Problem

To solve the above-described problems, a manufacturing method of a glass roll according to the present invention includes forming a functional film on a glass film transported by a transport device while heating the glass film in a state where the glass film is in contact with a heating roller and winding the glass film on which the functional film is formed into a roll shape. The glass film is coupled to a lead film via a coupling portion, and the transport device is configured to separate the lead film and/or the coupling portion from the heating roller when the lead film and/or the coupling portion pass by the heating roller.

According to such a configuration, the lead film is separated from the heating roller and transported by the transport device without being brought into contact with the heating roller, thereby making it possible to prevent alteration or melt of the lead film caused by heat of the heating roller. As a result, a film can be formed with heat on the glass film without causing deformation or breakage of the lead film. Further, the coupling portion is separated from the heating roller and transported by the transport device without being brought into contact with the heating roller, thereby making it possible to prevent alteration and melt of a coupling member (adhesive tape or the like) of the coupling portion. As a result, a film can be formed with heat on the glass film without causing separation of the lead film and the glass film at the coupling portion.

The transport device may include a transport roller configured to transport the lead film and the glass film, the transport roller may be configured to be movable close to and away from the heating roller, and the transport roller may be configured to separate the lead film and/or the coupling portion from the heating roller when the lead film and/or the coupling portion pass by the heating roller. Thus, the lead film is separated from the heating roller by the transport roller, thereby making it possible to suitably transport the lead film without causing deformation or breakage of the lead film. Further, the coupling portion is separated from the heating roller by the transport roller, thereby making it possible to suitably transport the coupling portion without causing separation of the lead film and the glass film.

The transport roller may include a pair of transport rollers configured to sandwich the lead film. With this configuration, the transport roller can adjust tension acting on the lead film. Accordingly, the transport roller can suitably transport the lead film and/or the coupling portion with the lead film and/or the coupling portion separated from the heating roller.

The transport device may include a separation member configured to separate the lead film and/or the coupling portion from the heating roller when the lead film and/or the coupling portion pass by the heating roller. As a result, the lead film and/or the coupling portion can be reliably separated from the heating roller.

The separation member may be a roller. As a result, the lead film and/or the coupling portion can be suitably transported while separated from the heating roller.

Further, the transport device may include a heat-blocking member configured to be interposed between the heating roller and the lead film and/or the coupling portion. Since the heat from the heating roller is blocked by the heat-blocking member, alteration or melt of the lead film or alteration or melt of the coupling member (adhesive tape or the like) can be reliably prevented.

To solve the above-described problems, a manufacturing device for a glass roll according to the present invention includes a transport device configured to transport a glass film coupled to a lead film via a coupling portion and a heating film formation device configured to form a functional film on the glass film. The heating film formation device includes a heating roller configured to come into contact with and heat the glass film, and the transport device includes an unwinding device configured to feed out the glass film, a winding device configured to wind the glass film on which the functional film is formed into a roll shape, a transport roller disposed between the unwinding device and the winding device and configured to transport the glass film, and a separation member configured to separate the lead film and/or the coupling portion from the heating roller when the lead film and/or the coupling portion pass by the heating roller.

According to such a configuration, when the lead film passes by the heating roller, the lead film can be separated from the heating roller by the separation member of the transport device. As a result, alteration or melt of the lead film caused by the heat of the heating roller can be prevented. Accordingly, a film can be formed with heat on the glass film without causing deformation or breakage of the lead film. Further, when the coupling portion between the lead film and the glass film passes by the heating roller, the coupling portion can be separated from the heating roller by the separation member. As a result, alteration or melt of a coupling member (adhesive tape or the like) of the coupling portion can be prevented. Accordingly, a film can be formed with heat on the glass film without causing separation of the lead film and the glass film at the coupling portion.

To solve the problems described above, a manufacturing method of a glass roll according to the present invention includes forming a functional film on a glass film transported by a transport device while heating the glass film in a state where the glass film is in contact with a heating roller and winding the glass film on which the functional film is formed into a roll shape. The glass film is coupled to a lead film via a coupling portion, and the heating roller includes a roller main body configured to come into contact with and heat the glass film and a separation member configured to separate the lead film and/or the coupling portion from the roller main body when the lead film and/or the coupling portion pass by the roller main body.

According to such a configuration, when the lead film passes by the roller main body of the heating roller, the lead film can be separated from the roller main body by the separation member. As a result, alteration or melt of the lead film caused by heat of the roller main body can be prevented. Accordingly, a film can be formed with heat on the glass film without causing deformation or breakage of the lead film. Further, when the coupling portion between the lead film and the glass film passes by the roller main body, the coupling portion can be separated from the roller main body by the separation member. As a result, alteration or melt of a coupling member (adhesive tape or the like) of the coupling portion can be prevented. Accordingly, a film can be formed with heat on the glass film without causing separation of the lead film and the glass film at the coupling portion.

To solve the above-described problems, a manufacturing device for a glass roll according to the present invention includes a transport device configured to transport a glass film coupled to a lead film via a coupling portion and a heating film formation device configured to form a functional film on the glass film. The heating film formation device includes a heating roller configured to come into contact with and heat the glass film, and the heating roller includes a roller main body configured to come into contact with and heat the glass film and a separation member configured to separate the lead film and/or the coupling portion from the roller main body when the lead film and/or the coupling portion pass by the roller main body.

According to such a configuration, when the lead film passes by the roller main body of the heating roller, the lead film can be separated from the roller main body by the separation member. As a result, alteration or melt of the lead film caused by heat of the roller main body can be prevented. Accordingly, a film can be formed with heat on the glass film without causing deformation or breakage of the lead film. Further, when the coupling portion between the lead film and the glass film passes by the roller main body, the coupling portion can be separated from the roller main body by the separation member. As a result, alteration or melt of a coupling member (adhesive tape or the like) of the coupling portion can be prevented. Accordingly, a film can be formed with heat on the glass film without causing separation of the lead film and the glass film at the coupling portion.

Advantageous Effects of Invention

According to the present invention, a film can be formed with heat on a glass film without causing deformation or breakage of a lead film. Further, a film can be formed with heat on a glass film without causing separation of a lead film and a glass film at a coupling portion.

DESCRIPTION OF EMBODIMENTS

Hereinafter, embodiments for implementing the present invention will be described with reference to the drawings. FIGS. 1 to 4 illustrate a first embodiment of a manufacturing method and a manufacturing device for a glass roll according to the present invention.

The manufacturing device used in this method adopts a roll-to-roll method, and is configured to manufacture a glass roll by forming a functional film on a transparent glass film unwound from a base glass roll, and winding the glass film on which the functional film is formed into a roll shape. Hereinafter, the glass film to be unwound from the base glass roll is referred to as a first glass film, and the glass film after the functional film has been formed thereon is referred to as a second glass film.

Figure 1:
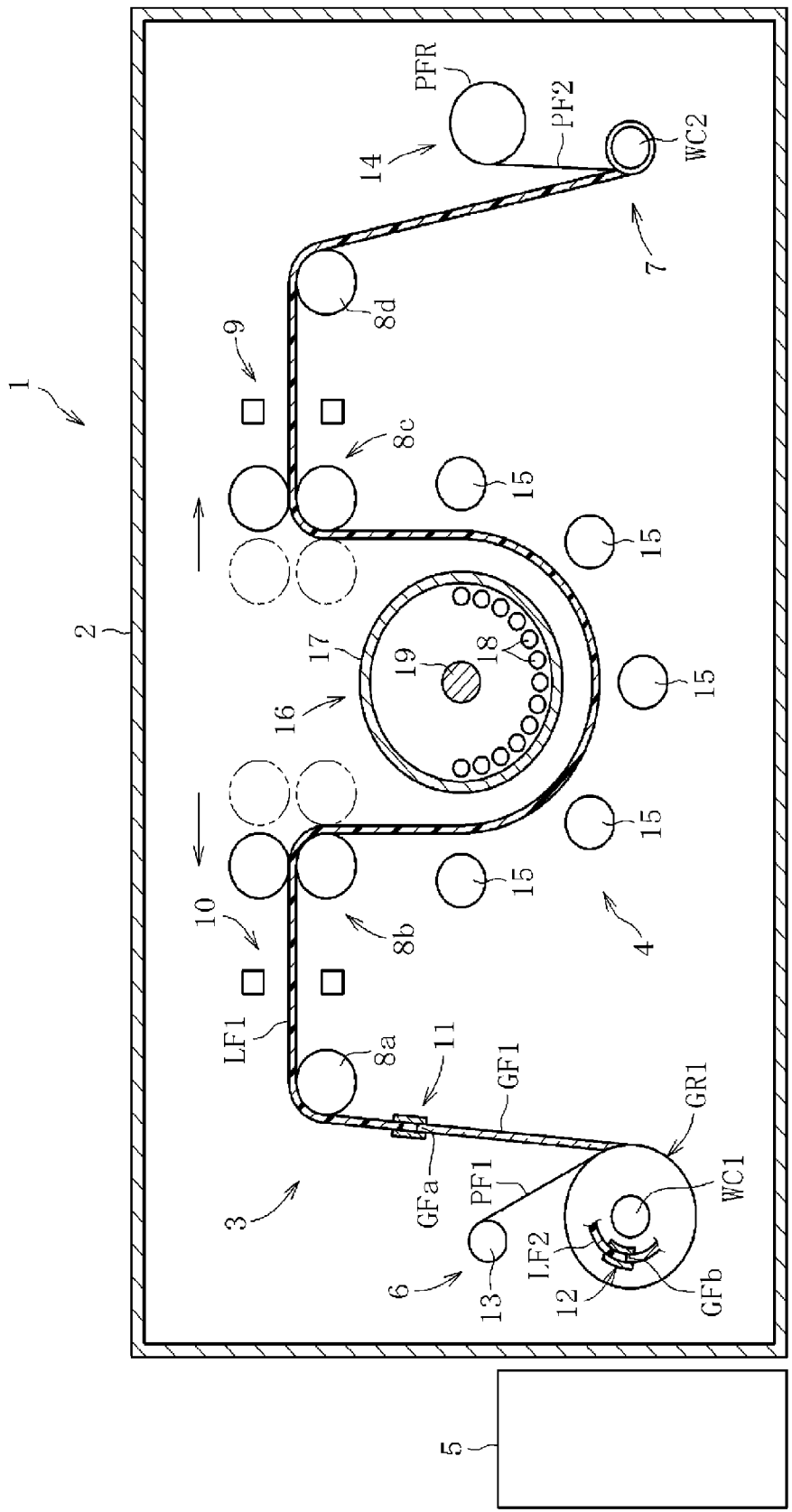
FIG. 1 is a cross-sectional view illustrating a manufacturing device for a glass roll according to a first embodiment.

As illustrated in FIG. 1, a manufacturing device 1 primarily includes a vacuum chamber 2, a transport device 3, a film formation device 4, and a control device 5 that controls the transport device 3 and the film formation device 4.

The vacuum chamber 2 houses the transport device 3 and the film formation device 4 in an interior of the vacuum chamber 2. An internal space of the vacuum chamber 2 is set to a predetermined degree of vacuum by a vacuum pump. An inert gas, such as argon gas, can be supplied into the vacuum chamber 2.

The transport device 3 includes an unwinding device 6, a winding device 7, transport rollers 8a to 8d disposed between the unwinding device 6 and the winding device 7, and sensors 9, 10.

The unwinding device 6 rotatably supports a base glass roll GR1 and unwinds a first glass film GF1 from the base glass roll GR1 to feed the first glass film GF1 to the film formation device 4. The unwinding device 6 can change a rotational speed of the base glass roll GR1 (feeding rate of the first glass film GF1) according to the control of the control device 5.

The base glass roll GR1 mounted to the unwinding device 6 includes the first glass film GF1, a first lead film LF1 coupled to a starting end portion GFa of the first glass film GF1, a second lead film LF2 coupled to a terminating end portion GFb of the first glass film GF1, a protective film PF1 layered on the first glass film GF1, and a winding core WC1.

The first glass film GF1 and each of the lead films LF1, LF2 are coupled by a coupling member such as an adhesive tape. Hereinafter, a coupling portion between the starting end portion GFa of the first glass film GF1 and the first lead film LF1 is referred to as a first coupling portion 11, and a coupling portion between the terminating end portion GFb of the first glass film GF1 and the second lead film LF2 is referred to as a second coupling portion 12. A first end portion (starting end portion) of the second lead film LF2 is coupled, via the second coupling portion 12, to the terminating end portion GFb of the first glass film GF1, and a second end portion (terminating end portion) of the second lead film F2 is coupled to the winding core WC1.

A thickness of the first glass film GF1 is 500 µm or less, preferably from 10 µm to 300 µm, and most preferably from 30 µm to 200 µm.

As the material of the first glass film GF1, silicate glass or silica glass is used, preferably borosilicate glass, soda-lime glass, aluminosilicate glass, or chemically strengthened glass is used, and most preferably alkali-free glass is used. Here, alkali-free glass refers to a glass that is substantially free of alkali components (alkali metal oxides), and specifically a glass with an alkali component having a weight ratio of 3000 ppm or less. The weight ratio of the alkali component in the present invention is preferably 1000 ppm or less, more preferably 500 ppm or less, and most preferably 300 ppm or less.

A film made of a resin is used for each of the lead films LF1, LF2. Specifically, as each of the lead films LF1, LF2, an organic resin film (synthetic resin film) such as a polyethylene terephthalate film, an ionomer film, a polyethylene film, a polypropylene film, a polyvinyl chloride film, a polyvinylidene chloride film, a polyvinyl alcohol film, a polyester film, a polycarbonate film, a polystyrene film, a polyacrylonitrile film, an ethylene-vinyl acetate copolymer film, an ethylene-vinyl alcohol copolymer film, an ethylene-methacrylic acid copolymer film, a nylon (trade name) film (polyamide film), a polyimide film, or cellophane, for example, can be used.

The unwinding device 6 includes a protective film recovery unit 13 configured to wind the protective film PF1 included in the base glass roll GR1. The protective film recovery unit 13 is disposed at a position above the unwinding device 6, but is not limited to this position. The protective film recovery unit 13 recovers the protective film PF1 by peeling off the protective film PF1 from the first glass film GF1 on which the protective film PF1 is layered and winding the protective film PF1 into a roll shape.

The transport rollers 8a to 8d include the first transport roller 8a and the second transport roller 8b that transport the first glass film GF1, and the third transport roller 8c and the fourth transport roller 8d that transport a second glass film GF2. The number of the transport rollers 8a to 8d is not limited to that in this embodiment, and can be appropriately set according to the size of the manufacturing device 1. Each of the transport rollers 8a to 8d is rotationally driven by a drive device such as an electric motor.

The first transport roller 8a and the second transport roller 8b are disposed at an interval between the unwinding device 6 and the film formation device 4. The third transport roller 8c and the fourth transport roller 8d are disposed at an interval between the film formation device 4 and the winding device 7.

The first transport roller 8a and the fourth transport roller 8d are each constituted by a single roller that comes into contact with one surface of each of the lead films LF1, LF2 and the glass films GF1, GF2. The second transport roller 8b and the third transport roller 8c are constituted by a pair of (two) rollers that come into contact with both surfaces of each of the lead films LF1, LF2 and the glass films GF1, GF2.

The second transport roller 8b and the third transport roller 8c are configured to be movable close to and away from the film formation device 4 by a movement device (not illustrated). The second transport roller 8b and the third transport roller 8c can move to a first position (lead film transport position, position indicated by a solid line in FIG. 1) away from the film formation device 4 for transporting the lead films LF1, LF2, and to a second position (glass film transport position, position indicated by a two-dot chain line in FIG. 1) close to the film formation device 4 for transporting the glass films GF1, GF2.

The second transport roller 8b and the third transport roller 8c cause the lead films LF1, LF2 to pass therethrough without coming into contact with the film formation device 4. That is, the second transport roller 8b and the third transport roller 8c, and the movement device thereof, also function as a separation device that separates the lead films LF1, LF2 from the film formation device 4 when the lead films LF1, LF2 pass through the film formation device 4. In particular, the second transport roller 8b and the third transport roller 8c function as a separation member that separates the lead films LF1, LF2 from the film formation device 4 by rotational control performed by the control device 5.

The sensors 9, 10 include the first sensor 9 disposed downstream of the film formation device 4 (between the film formation device 4 and the winding device 7), and the second sensor 10 disposed upstream of the film formation device 4 (between the unwinding device 6 and the film formation device 4). Each of the sensors 9, 10 is constituted by a non-contact sensor, such as a transmission laser sensor, but is not limited to this configuration.

The first sensor 9 detects the first coupling portion 11 and the starting end portion GFa of the first glass film GF1, and transmits a detection signal to the control device 5. The second sensor 10 detects the second coupling portion 12 and the terminating end portion GFb of the first glass film GF1, and transmits a detection signal to the control device 5.

The winding device 7 forms a glass roll GR2 by layering a protective film PF2 on the second glass film GR2 and winding the film around a winding core WC2. The winding device 7 can change a rotational speed of the winding core WC2 by the control of the control device 5.

The winding device 7 includes a protective film supply unit 14 that supplies the protective film PF2 to the second glass film GF2 to be wound around the winding core WC2. The protective film supply unit 14 is disposed at a position above the winding device 7, but is not limited to this position. The protective film supply unit 14 includes a protective film roll PFR, and supplies the protective film PF2 unwound from the protective film roll PFR to the second glass film GF2.

The film formation device 4 is constituted by a heating film formation device that transports the first glass film GF1 while heating the first glass film GF1, and forms a functional film on the first glass film GF1. The film formation device 4 can form the functional film on the first glass film GF1 by various film formation methods such as sputtering, vapor deposition, and chemical vapor deposition (CVD). In this embodiment, a case in which a transparent conductive film, such as an indium tin oxide (ITO) film, is formed as the functional film by sputtering will be described.

The film formation device 4 is constituted by an ion beam sputtering device, a magnetron sputtering device, or the like. When the film formation device 4 is a sputtering device, the film formation device 4 primarily includes a plurality of sputtering sources 15 including a target, and a heating roller 16 that heats the first glass film GF1.

Each sputtering source 15 is disposed at a constant interval from the heating roller 16 such that sputtered particles (ITO particles) that scatter from the target adhere to one surface of the first glass film GF1.

The heating roller 16 is a rotatable roller (a can-roller) that heats while coming into contact with the first glass film GF1. The heating roller 16 includes a roller main body 17 having a cylindrical shape and configured to support the first glass film GF1, and a heater 18 that heats the roller main body 17.

The roller main body 17 is formed from glass, ceramic, or metal. The roller main body 17 is rotatably supported by a shaft portion 19.

The heater 18 is disposed inside the roller main body 17 to heat the roller main body 17. The heater 18 is constituted by, for example, an oil heater, an infrared heater, or a near infrared heater, but is not limited to this configuration.

The control device 5 includes a computer (for example, a personal computer (PC)) that implements various hardware such as a central processing unit (CPU), a read only memory (ROM), a random access memory (RAM), a hard-disk drive (HDD), an input/output interface, and a display. The control device 5 is communicably connected to the film formation device 4, the unwinding device 6, the winding device 7, the transport rollers 8a to 8d, the movement device of the second transport roller 8b and the third transport roller 8c, and the sensors 9, 10. The control device 5 executes control related to the heating temperature, film formation, and transport of the film formation device 4, control of the unwinding device 6, control of the winding device 7, rotational control of the transport rollers 8a to 8d, repositioning control of the second transport roller 8b and the third transport roller 8c, and the like.

Figure 2:
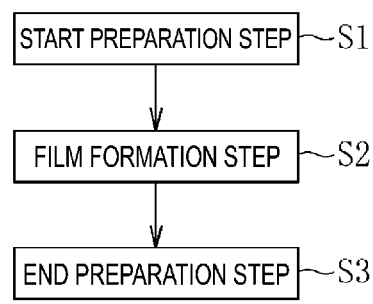
FIG. 2 is a flowchart illustrating a manufacturing method of a glass roll.

Hereafter, a method of manufacturing a glass roll using the manufacturing device 1 having the above-described configuration will be described. As illustrated in FIG. 2, this method includes a start preparation step S1, a film formation step S2, and an end preparation step S3.

In the start preparation step S1, the base glass roll GR1 is mounted on the unwinding device 6, the first lead film LF1 is unwound from the base glass roll GR1, and the starting end portion of the first lead film LF1 is coupled to the winding core WC2 of the winding device 7. In this case, the transport device 3 places the second transport roller 8b and the third transport roller 8c at the first position (lead film transport position). As illustrated in FIG. 1, a portion of the first lead film LF1 positioned between the second transport roller 8b and the third transport roller 8c is in a state of being separated from the heating roller 16 of the film formation device 4. The second transport roller 8b and the third transport roller 8c sandwich the first lead film LF1, making it possible to apply appropriate tension to the first lead film LF1 in a region from the unwinding device 6 to the second transport roller 8b and a region from the third transport roller 8c to the winding device 7 while maintaining a state of the first lead film LF1 being separated from the heating roller 16 as described above.

Subsequently, the vacuum chamber 2 is closed and the internal space thereof is set to a predetermined degree of vacuum. Further, the vacuum chamber 2 is filled with an inert gas.

Subsequently, the control device 5 synchronously activates the unwinding device 6, the transport rollers 8a to 8d, the roller main body 17 of the heating roller 16, and the winding device 7 and transports the first lead film LF1 from the unwinding device 6 on the upstream side to the winding device 7 on the downstream side at a predetermined speed. Further, the control device 5 starts the heater 18 of the film formation device 4, and starts heating the roller main body 17 (temperature increase step).

In the temperature increase step, the roller main body 17 is heated by the heater 18 to a predetermined film formation temperature or higher. The temperature of the roller main body 17 to be heated is set to from 200° C. to 500° C., for example, but the temperature is not limited to this range. Note that, during execution of the temperature increase step, the sputtering sources 15 are not activated and do not emit sputtered particles.

The control device 5 controls rotational speeds of the second transport roller 8b and the third transport roller 8c, and maintains the state in which the first lead film LF1 is separated from the heating roller 16 of the film formation device 4 in a region between the second transport roller 8b and the third transport roller 8c. The first lead film LF1 that bypasses the heating roller 16 is wound onto the winding device 7 via the third transport roller 8c and the fourth transport roller 8d.

In the start preparation step S1, the first lead film LF1 having passed through the film formation device 4 is wound onto the winding device 7, thereby unwinding the first glass film GF1 included in the base glass roll GR1 from the base glass roll GR1. The first glass film GF1 is transported to the winding device 7 via the film formation device 4 together with the first lead film LF1.

Figure 3:
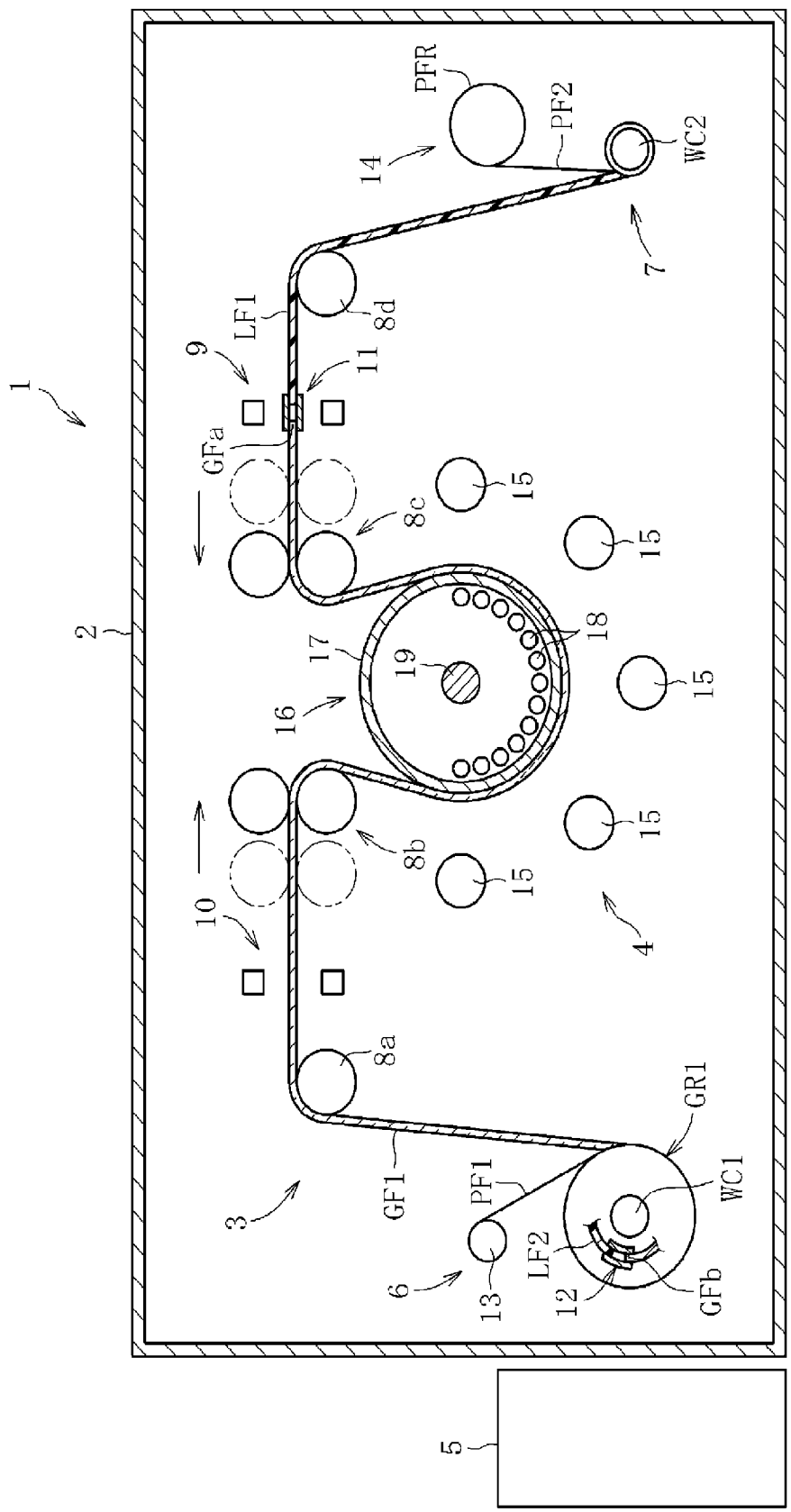
FIG. 3 is a cross-sectional view illustrating one step of the manufacturing method of a glass roll.

As illustrated in FIG. 3, when the first coupling portion 11 has passed through the film formation device 4, the first sensor 9 detects the first coupling portion 11 and the starting end portion GFa of the first glass film GF1, and transmits a detection signal to the control device 5. Upon receiving the detection signal from the first sensor 9, the control device 5 determines whether or not the roller main body 17 is heated to a predetermined film formation temperature. In a case in which the roller main body 17 has not reached the film formation temperature, the control device 5 continues the temperature increase step. In a case in which the roller main body 17 has reached the film formation temperature, the control device 5 ends the start preparation step S1 and starts the next film formation step S2.

In the film formation step S2, the control device 5 transmits a control signal to the transport device 3, and moves the second transport roller 8b and the third transport roller 8c in a first position (position indicated by a two-dot chain line in FIG. 3) to a second position (position indicated by a solid line in FIG. 3). Furthermore, the control device 5 controls a transport speed of the first glass film GF1 by the transport device 3, and brings the first glass film GF1 into contact with the heating roller 16 of the film formation device 4. In this embodiment, the second transport roller 8b and the third transport roller 8c are moved to the second position (brought close to the heating roller 16), making it possible to secure, to the extent possible, a large holding angle of the first glass film GF1 on the heating roller 16.

In the film formation step S2, the roller main body 17 guides, by the rotation of the roller main body 17, the first glass film GF1 downstream while heating the first glass film GF1. The first glass film GF1 is heated to 150° C. or higher by the roller main body 17. In a case in which the sputtered particles are ITO, the first glass film GF1 is desirably heated to 200° C. or higher, more desirably heated to 250° C. or higher, and most desirably heated to 300° C. or higher.

By the control of the control device 5, the film formation device 4 causes the sputtered particles (ITO particles, for example) to scatter from the plurality of sputtering sources 15 and sequentially adhere to the first glass film GF1 transported by the roller main body 17.

With the first glass film GF1 heated by the roller main body 17, the ITO particles adhering to the first glass film GF1 crystallize, and a functional film FM having a low resistance (20 Ω/sq or less, for example) is formed. As a result, the second glass film GF2 is formed as illustrated in FIG. 4.

Figure 4:
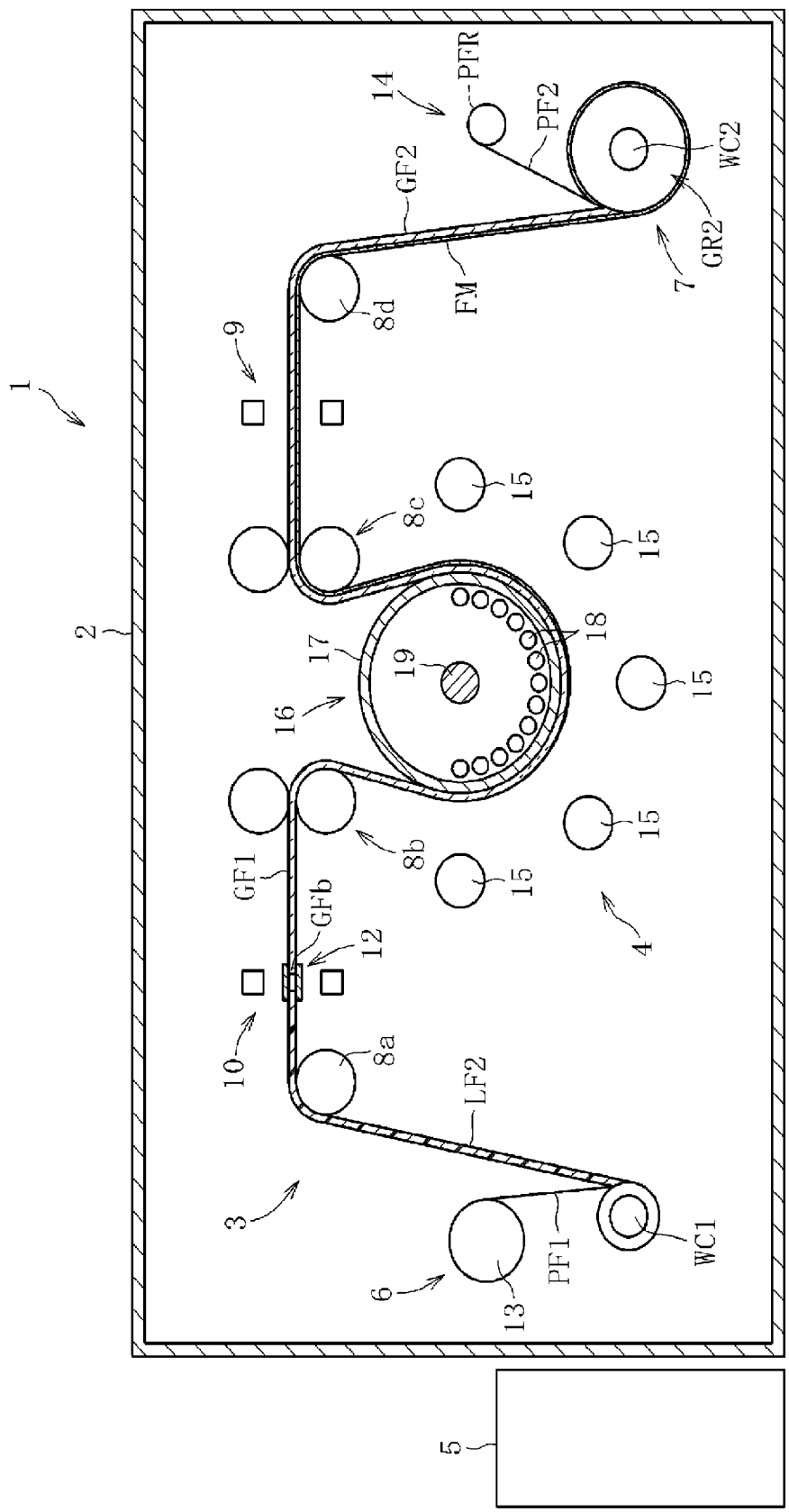
FIG. 4 is a cross-sectional view illustrating one step of the manufacturing method of a glass roll.

As illustrated in FIG. 4, in the film formation step S2, while the protective film PF2 is layered on the second glass film GF2 by the protective film supply unit 14, the second glass film GF2 and the protective film PF2 are wound around the winding core WC2 by the winding device 7. As a result, a glass roll GR2 is formed around the winding core WC2. The outer diameter of the glass roll GR2 expands according to the rotation of the winding core WC2.

When the film formation step S2 is nearly completed, the first glass film GF1 is fed out from the unwinding device 6 in its entirety. Subsequently, the second coupling portion 12 is fed out from the unwinding device 6. When the second coupling portion 12 reaches the second sensor 10, the second sensor 10 detects the second coupling portion 12 and the terminating end portion GFb of the first glass film GF1, and transmits a detection signal to the control device 5.

Upon receiving the detection signal from the second sensor 10, the control device 5 ends the film formation step S2 and starts the end preparation step S3. The end preparation step S3 includes a temperature decrease step of decreasing the temperature of the film formation device 4 in order to prevent deformation or breakage of the second lead film LF2 and separation of the first glass film GF1 and the second lead film LF2 at the second coupling portion 12. This temperature decrease step starts while the first glass film GF1 passes through the film formation device 4 and before the terminating end portion GFb reaches the film formation device 4.

In the temperature decrease step, the control device 5 stops the heating by the heating roller 16. When the heater 18 stops, the temperature of the roller main body 17 gradually decreases. Further, the control device 5 stops the sputtering sources 15 of the film formation device 4.

The control device 5 moves the second transport roller 8b and the third transport roller 8c in the second position (glass film transport position) to the first position (lead film transport position). Furthermore, the control device 5 controls the rotational speed of the winding core WC1 of the unwinding device 6, the transport rollers 8a to 8d, and the winding core WC2 of the winding device 7, and causes the second lead film LF2 to be separated from the heating roller 16 in a region between the second transport roller 8b and the third transport roller 8c.

The control device 5 controls the rotational speed of the second transport roller 8b and the third transport roller 8c, and maintains a state in which the second lead film LF2 is separated from the heating roller 16 of the film formation device 4. The second lead film LF2 that has bypassed the heating roller 16 is wound onto the winding device 7 via the third transport roller 8c and the fourth transport roller 8d.

When the second lead film LF2 that has passed through the film formation device 4 is wound onto the winding device 7, the end preparation step S3 ends and the glass roll GR2 is completed in a state of being supported by the winding device 7. The glass roll GR2 is removed from the vacuum chamber 2 and fed to the next step.

Note that, in the subsequent step, the second glass film GF2 is unwound from the glass roll GR2, and a predetermined circuit pattern (an electrode pattern, for example) is formed in the functional film FM by a method such as photolithography. When a predetermined manufacturing-related process is performed, the protective film PF2 is removed (peeled) from the second glass film GF2.

According to the manufacturing method and the manufacturing device 1 for the glass roll GR2 according to the embodiment described above, in a case in which the lead films LF1, LF2 are transported by the control of the transport device 3 performed by the control device 5, the transport path (path line) can be changed to a transport path that differs from the transport path of the glass films GF1, GF2.

That is, in the start preparation step S1 and the end preparation step S3, the lead films LF1, LF2 are separated from the heating roller 16, making it possible to cause the lead films LF1, LF2 to bypass and not come into contact with the heating roller 16. With this bypass path, the lead films LF1, LF2 can be transported without alteration or melt. Accordingly, the functional film FM can be formed on the first glass film GF1 without causing deformation or breakage of the lead films LF1, LF2.

Similarly, each of the coupling portions 11, 12 is separated from the heating roller 16 by a bypass path, making it possible to transport the coupling portions 11, 12 without causing alteration or melt of the coupling member such as adhesive tape. Accordingly, the functional film FM can be formed on the first glass film GF1 without causing separation of the first glass film GF1 and the lead films LF1, LF2 at each of the coupling portions 11, 12.

Further, in the start preparation step S1, the temperature increase step can be performed without stopping the transport of the first lead film LF1, making it possible to shorten the time spent on the start preparation step S1 to the extent possible compared to a case in which the first lead film LF1 is brought into contact with the heating roller 16 and then transported. Accordingly, the glass roll GR2 can be efficiently manufactured.

Figure 5:
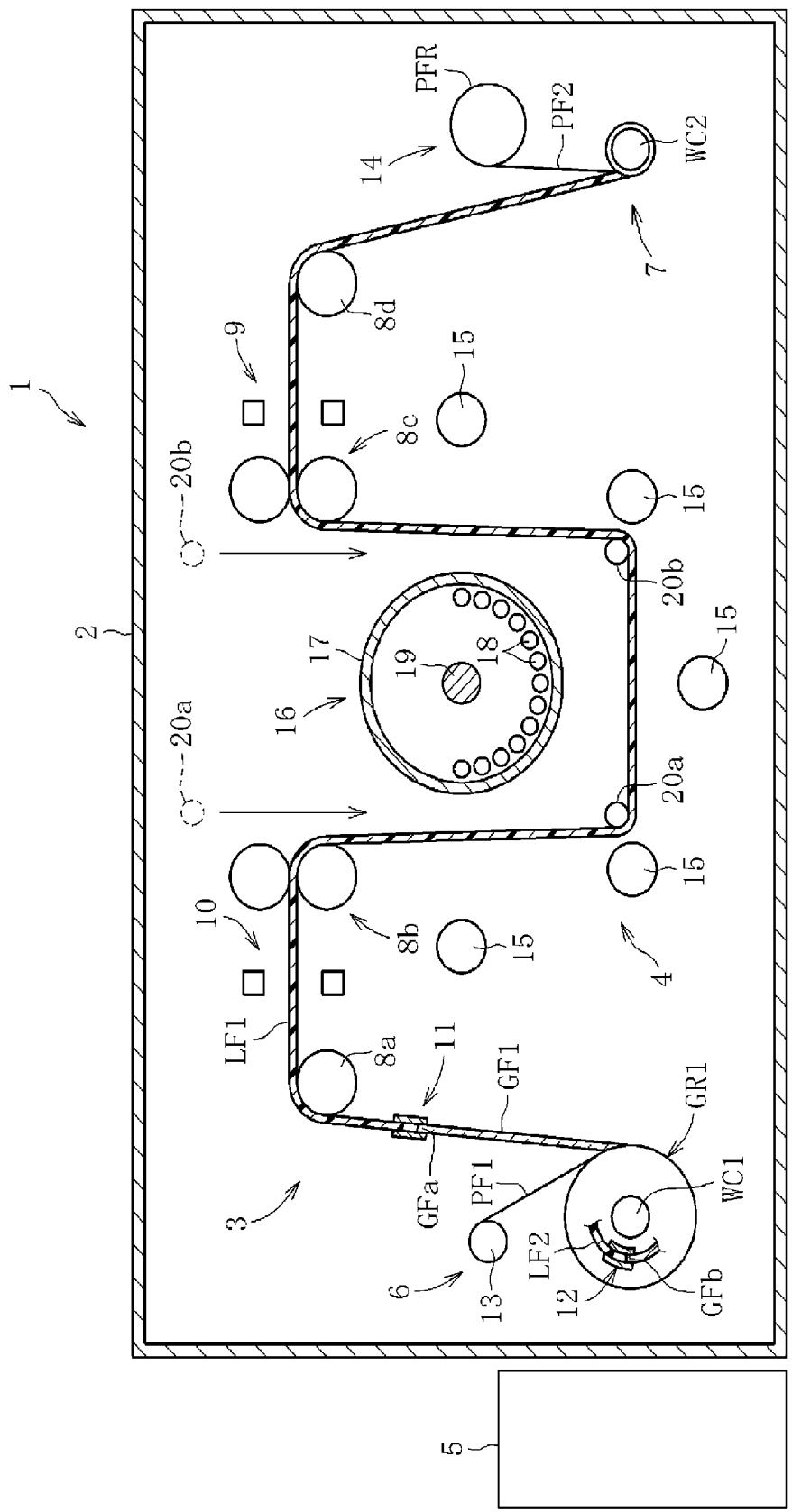
FIG. 5 is a cross-sectional view illustrating a manufacturing device for a glass roll according to a second embodiment.
Figure 6:
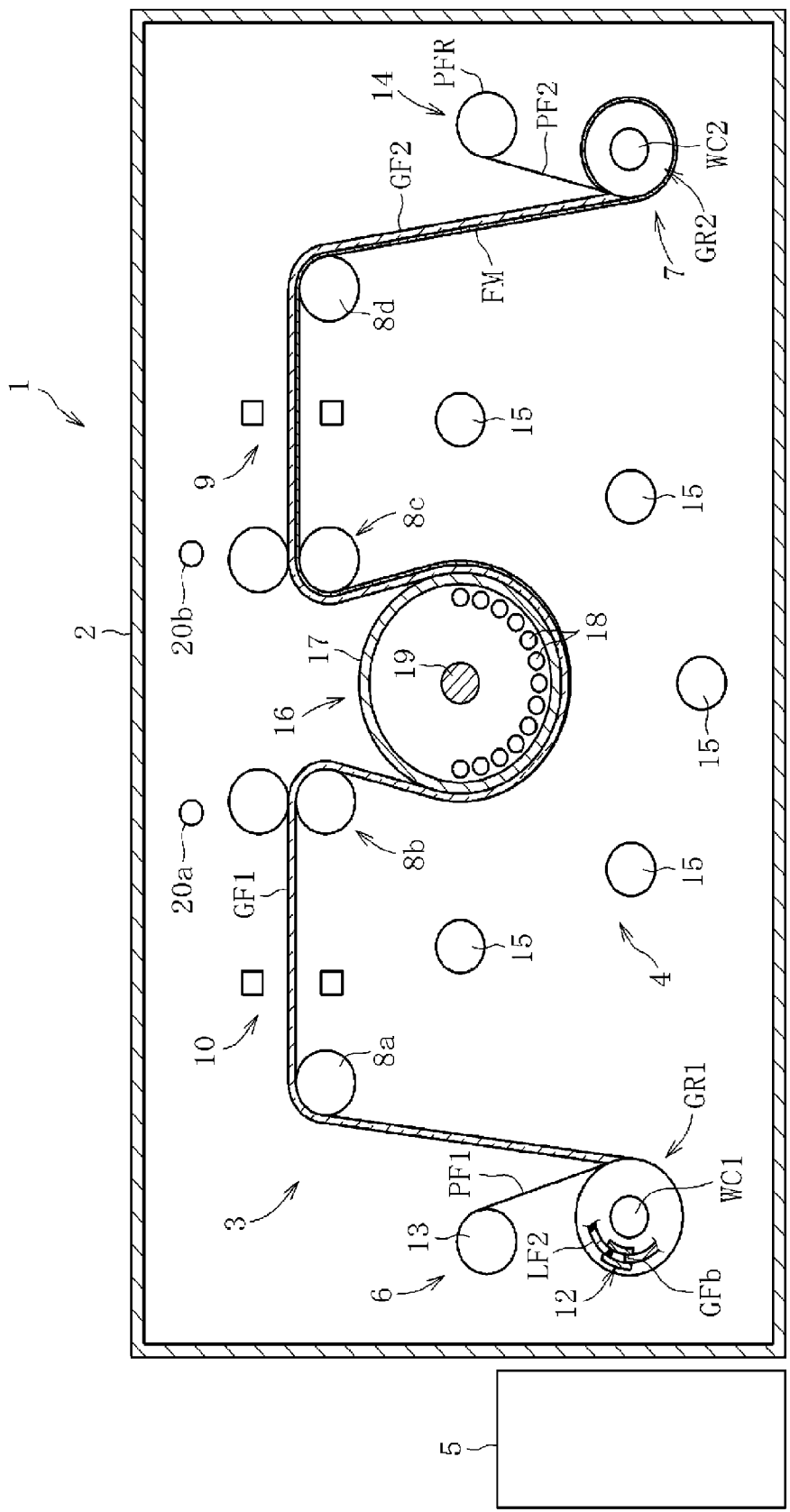
FIG. 6 is a cross-sectional view illustrating one step of a manufacturing method of a glass roll.

FIGS. 5 and 6 illustrate a second embodiment of the present invention. In this embodiment, the configuration of the transport device of the manufacturing device differs from that of the first embodiment.

In addition to the unwinding device 6, the winding device 7, and the transport rollers 8a to 8d, the transport device 3 includes a separation device that separates the lead films LF1, LF2 from the heating roller 16 of the film formation device 4. The separation device includes separation rollers 20a, 20b as a separation member, and a movement device that moves these separation rollers 20a, 20b. In this embodiment, two rollers are exemplified as the separation rollers 20a, 20b, but the number of the separation rollers 20a, 20b is not limited thereto in this embodiment and can be set as appropriate according to the size of the manufacturing device 1.

As illustrated in FIG. 5, the separation rollers 20a, 20b are configured to be repositionable, by the movement device, between a first position (lead film separation position, position indicated by a solid line in FIG. 5) at which the separation rollers 20a, 20b are in contact with the lead films LF1, LF2, and a second position (standby position, position indicated by a two-dot chain line in FIG. 5) at which the separation rollers 20a, 20b are not in contact with the lead films LF1, LF2. The separation rollers 20a, 20b include the first separation roller 20a that comes into contact with the lead films LF1, LF2 between the second transport roller 8b and the heating roller 16, and the second separation roller 20b that comes into contact with the lead films LF1, LF2 between the third transport roller 8c and the heating roller 16.

The other configurations of this embodiment are the same as those of the first embodiment. In this embodiment, components common to those of the first embodiment are denoted by the same reference numerals as those of the first embodiment.

Hereafter, a manufacturing method of the glass roll GR2 according to this embodiment will be described.

As illustrated in FIG. 5, in the start preparation step S1, each of the separation rollers 20a, 20b moves from the second position to the first position. In this case, the second transport roller 8b and the third transport roller 8c are disposed in the first position (lead film transport position). The first separation roller 20a passes between the second transport roller 8b and the heating roller 16 when moving to the first position. The second separation roller 20b passes between the third transport roller 8c and the heating roller 16 when moving to the first position.

In the first position, each of the separation rollers 20a, 20b is in contact with the first lead film LF1 and separate the first lead film LF1 from the heating roller 16. By the movement of each of the separation rollers 20a, 20b to the first position, a bypass path is formed that allows the first lead film LF1 to bypass the heating roller 16.

In the start preparation step S1, the control device 5 controls the unwinding device 6, the transport rollers 8a to 8d, and the winding device 7, and starts transport of the first lead film LF1. The control device 5 heats the roller main body 17 by the heater 18 while rotating the roller main body 17 (temperature increase step).

When the start preparation step S1 progresses and the first coupling portion 11 is detected by the first sensor 9, the control device 5 determines whether or not the heating roller 16 has reached the film formation temperature, similarly to the first embodiment. In a case in which the heating roller 16 has reached the film formation temperature, the control device 5 ends the start preparation step S1, and executes the next film formation step S2.

As illustrated in FIG. 6, in the film formation step S2, the separation rollers 20a, 20b move from the first position to the second position, which is the standby position. The second transport roller 8b and the third transport roller 8c move from the first position (lead film transport position) to the second position (glass film transport position), and bring the first glass film GF1 into contact with the heating roller 16.

Subsequently, the control device 5 starts the sputtering sources 15 and causes sputtered particles to adhere to the first glass film GF1 transported by the heating roller 16. As a result, the second glass film GF2 on which the functional film FM is formed, is formed. The second glass film GF2 is wound around the winding core WC2 of the winding device 7, thereby forming the glass roll GR2.

When the film formation step S2 progresses and the second coupling portion 12 is detected by the second sensor 10, the control device 5 ends the film formation step S2 and executes the next end preparation step S3. The control device 5 stops the heater 18 and the sputtering sources 15 while maintaining the rotation of the roller main body 17 of the film formation device 4 (temperature decrease step).

In the temperature decrease step, the control device 5 moves the second transport roller 8b and the third transport roller 8c in the second position (glass film transport position) to the first position (lead film transport position). Subsequently, the separation rollers 20a, 20b in the second position (standby position) move to the first position (lead film separation position) before the second coupling portion 12 reaches the heating roller 16 by the control of the control device 5.

The separation rollers 20a, 20b that have moved to the first position separate the second lead film LF2 to be transported by the transport device 3 from the heating roller 16. When the second lead film LF2 that has passed through the film formation device 4 is wound by the winding device 7 in its entirety, the glass roll GR2 is completed.

According to the manufacturing method and the manufacturing device 1 for the glass roll GR according to this embodiment, the lead films LF1, LF2 and the coupling portions 11, 12 are separated from the heating roller 16 by the separation rollers 20a, 20b, making it possible to maintain constant separation distances between the lead films LF1, LF2 and the heating roller 16 and between the coupling portions 11, 12 and the heating roller 16.

Figure 7:
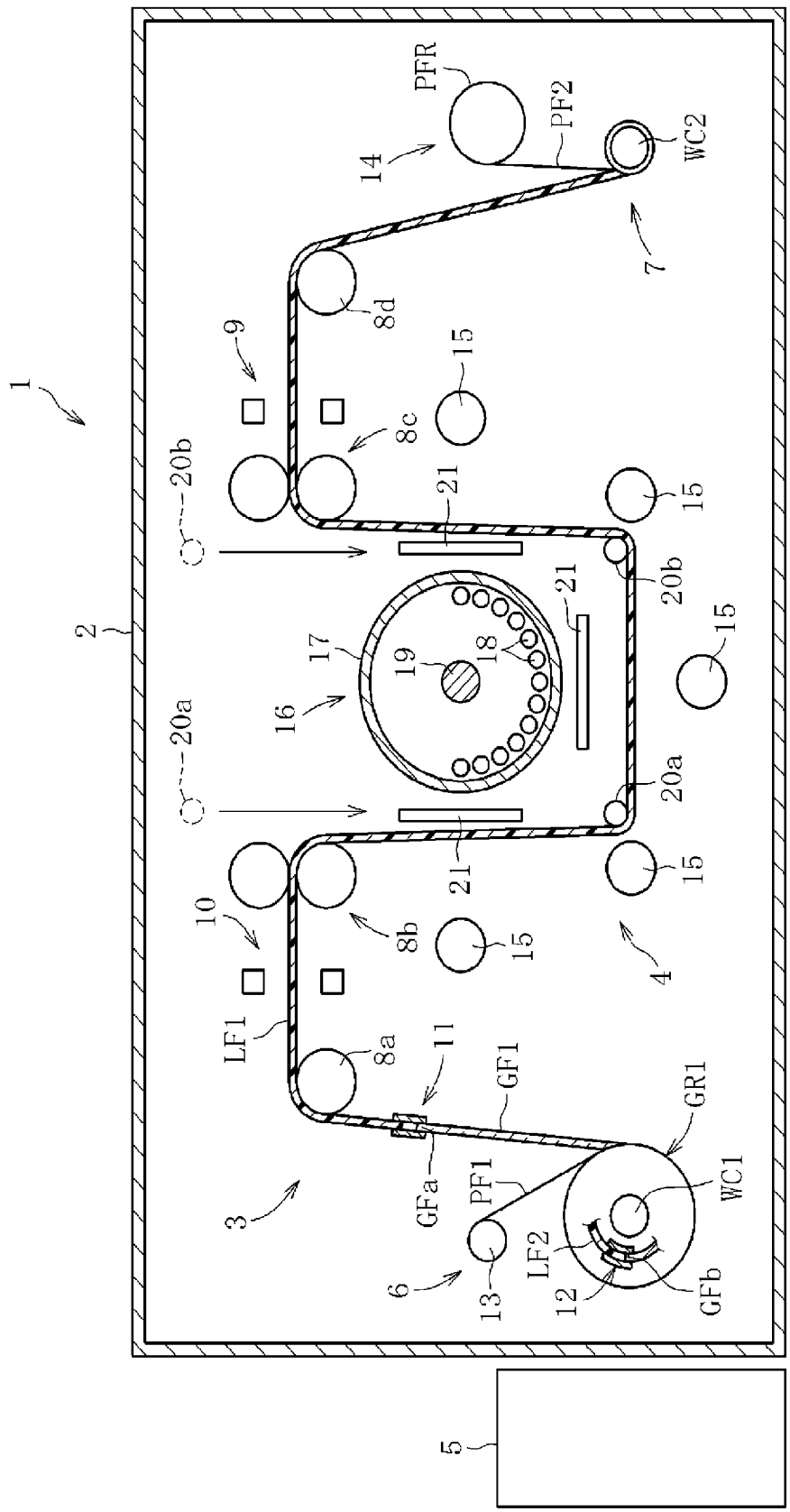
FIG. 7 is a cross-sectional view illustrating a manufacturing device for a glass roll according to a third embodiment.
Figure 8:
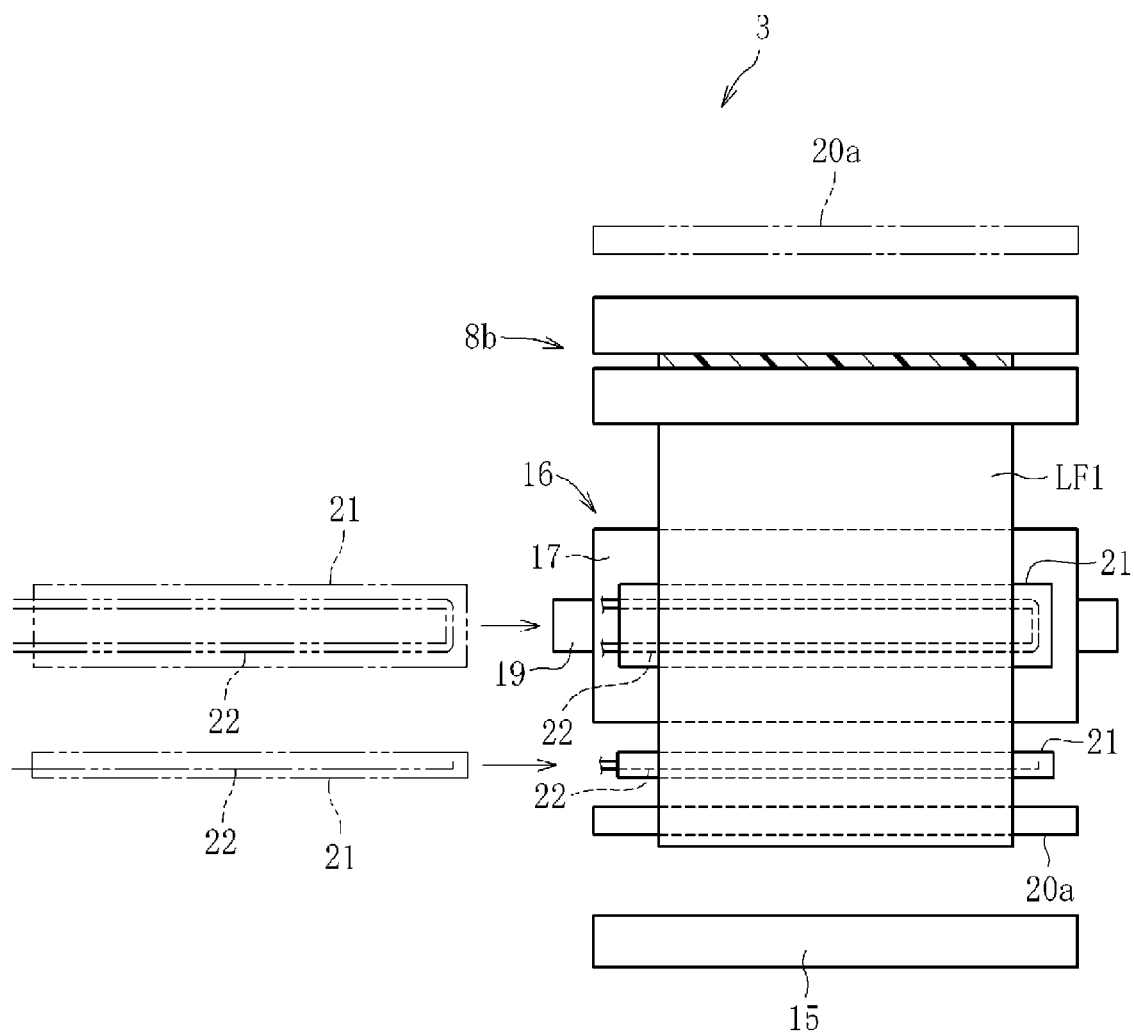
FIG. 8 is a side view illustrating a main portion of the manufacturing device for a glass roll.
Figure 9:
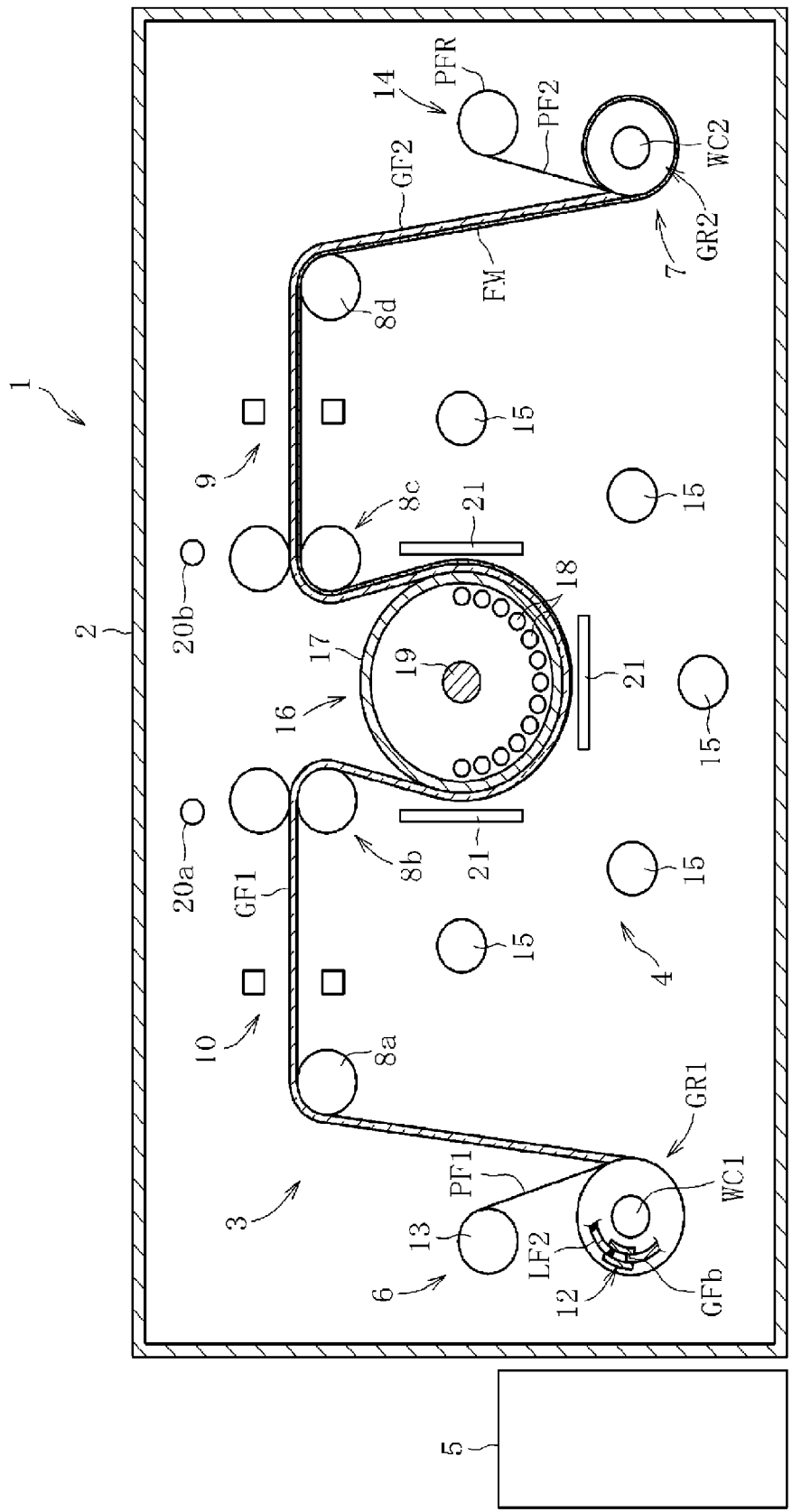
FIG. 9 is a cross-sectional view illustrating one step of a manufacturing method of a glass roll.

FIGS. 7 to 9 illustrate a third embodiment of the present invention. In addition to the unwinding device 6, the winding device 7, and the transport rollers 8a to 8d, the transport device 3 of the manufacturing device 1 according to this embodiment includes a separation device that separates the lead films LF1, LF2 from the heating roller 16 of the film formation device 4, and a heat-blocking device. The separation device includes the separation rollers 20a, 20b as a separation member, and a movement device that moves the separation rollers 20a, 20b. The heat-blocking device includes a heat-blocking plate 21 as a heat-blocking member, and a movement device that moves this heat-blocking plate 21.

As illustrated in FIGS. 7 and 8, the heat-blocking plate 21 is configured in a flat plate shape by a heat-blocking material, but the heat-blocking plate 21 is not limited to this shape and may be configured in various shapes such as an arcuate curved plate shape. In this embodiment, three heat-blocking plates 21 are exemplified, but the number of heat-blocking plates 21 is not limited to that in this embodiment.

A cooling pipe 22 is provided inside the heat-blocking plate 21. The cooling pipe 22 allows a coolant such as cooling water to circulate, thereby cooling the heat-blocking plate 21.

As illustrated in FIG. 8, the heat-blocking plate 21 is configured to be repositionable between a first position (position indicated by a solid line) where heat-blocking is performed and a second position (position indicated by a two-dot chain line) as a standby position, by the movement device. In the first position, the heat-blocking plate 21 is interposed between the roller main body 17 of the heating roller 16 and the lead films LF1, LF2. In the second position, the heat-blocking plate 21 is in a position separated from the heating roller 16 in an axial direction of the heating roller 16.

The other configurations of this embodiment are the same as those of the second embodiment. Components that are the same as those of the second embodiment in this embodiment are denoted by the same reference numerals as those of the second embodiment.

Hereafter, a manufacturing method for the glass roll GR2 according to this embodiment will be described.

In the start preparation step S1, the transport device 3 lowers each of the separation rollers 20a, 20b from the second position (standby position) to the first position (lead film separation position). In this case, the second transport roller 8b and the third transport roller 8c are disposed in the first position (lead film transport position).

Each of the separation rollers 20a, 20b comes into contact with the first lead film LF1, and separates the first lead film LF1 from the heating roller 16. Subsequently, by the control of the control device 5, the transport device 3 moves each of the heat-blocking plates 21 from the second position (standby position) to the first position (heat-blocking position). The heat-blocking plates 21 enter a space between the roller main body 17 of the heating roller 16 and the first lead film LF1 supported by the separation rollers 20a, 20b, and stop at the first position. Subsequently, the transport device 3 transports the first lead film LF1 downstream.

As illustrated in FIG. 9, in the film formation step S2, the transport device 3 moves the heat-blocking plates 21 in the first position to the second position. Subsequently, the transport device 3 raises the separation rollers 20a, 20b in the first position to the second position. Subsequently, the transport device 3 moves the second transport roller 8b and the third transport roller 8c in the first position to the second position (glass film transport position).

Subsequently, as illustrated in FIG. 9, the functional film FM is formed on the first glass film GF1 by the film formation device 4. In this case, since each of the heat-blocking plates 21 is in the second position (standby position) separated from the heating roller 16 in the axial direction of the heating roller 16, the sputtered particles emitted from the sputtering sources 15 can move toward the first glass film GF1 while the path is not obstructed by the heat-blocking plates 21.

Upon completion of the film formation step S2, the transport device 3 moves the second transport roller 8b and the third transport roller 8c in the second position to the first position (lead film transport position) in the end preparation step S3 (temperature decrease step). Subsequently, the transport device 3 moves the separation rollers 20a, 20b in standby in the second position to the first position (lead film separation position). Subsequently, the transport device 3 moves each of the heat-blocking plates 21 in standby in the second position to the first position (heat-blocking position).

According to the manufacturing method and the manufacturing device 1 for the glass roll GR2 according to this embodiment, in the start preparation step S1 and the end preparation step S3, the heat-blocking plates 21 are interposed between the heating roller 16 and the lead films LF1, LF2, making it possible to block the heat radiated from the heating roller 16 so as to not transmit the heat to the lead films LF1, LF2 and the coupling portions 11, 12. As a result, deformation and breakage of the lead films LF1, LF2 and separation of the first glass film GF1 and the lead films LF1, LF2 at the coupling portions 11, 12 can be effectively prevented.

FIGS. 10 to 13 illustrate a fourth embodiment of the present invention. In this embodiment, the configuration of the film formation device of the manufacturing device differs from that of the first embodiment.

Figure 10:
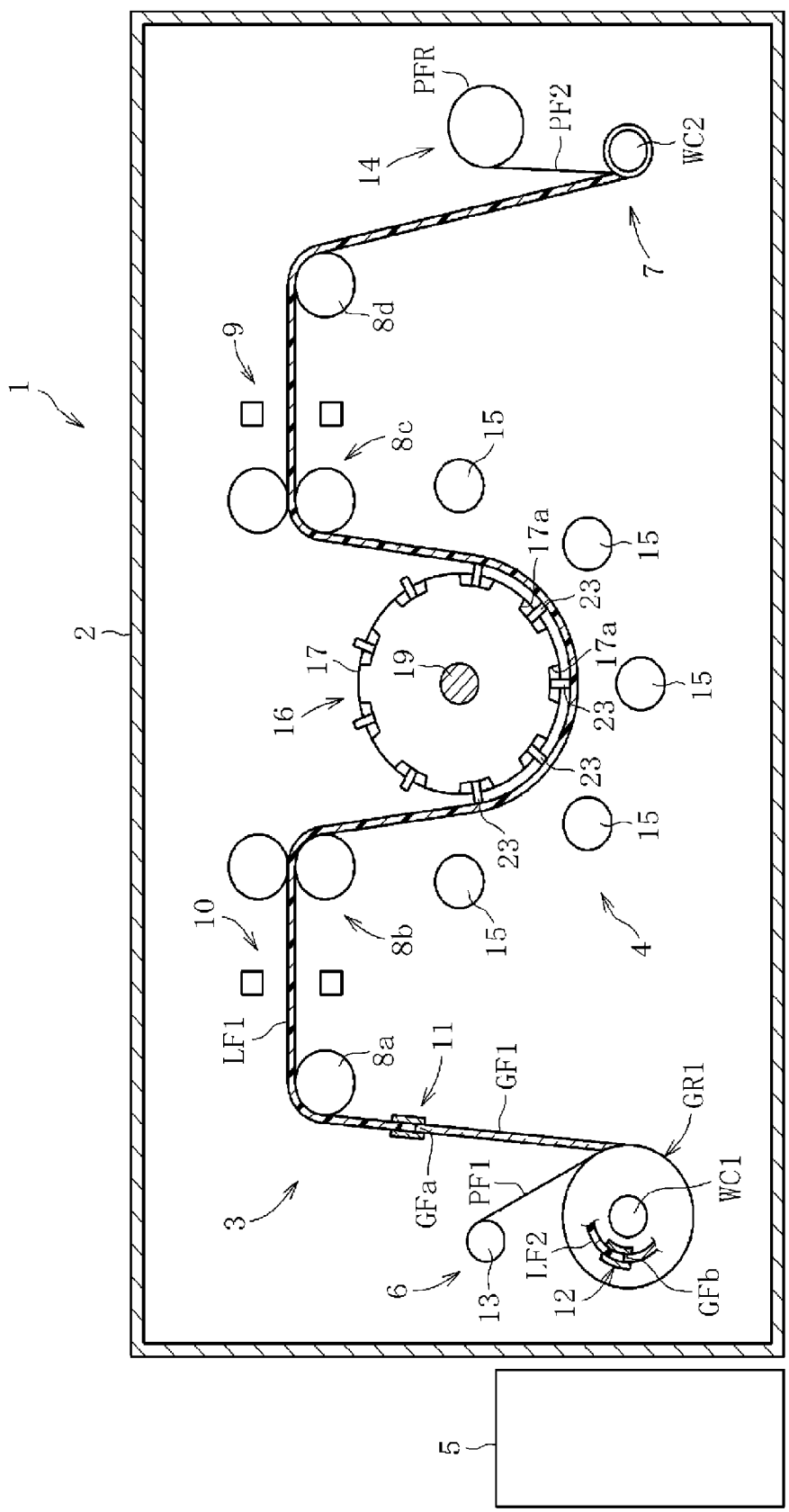
FIG. 10 is a cross-sectional view illustrating a manufacturing device for a glass roll according to a fourth embodiment.
Figure 11:
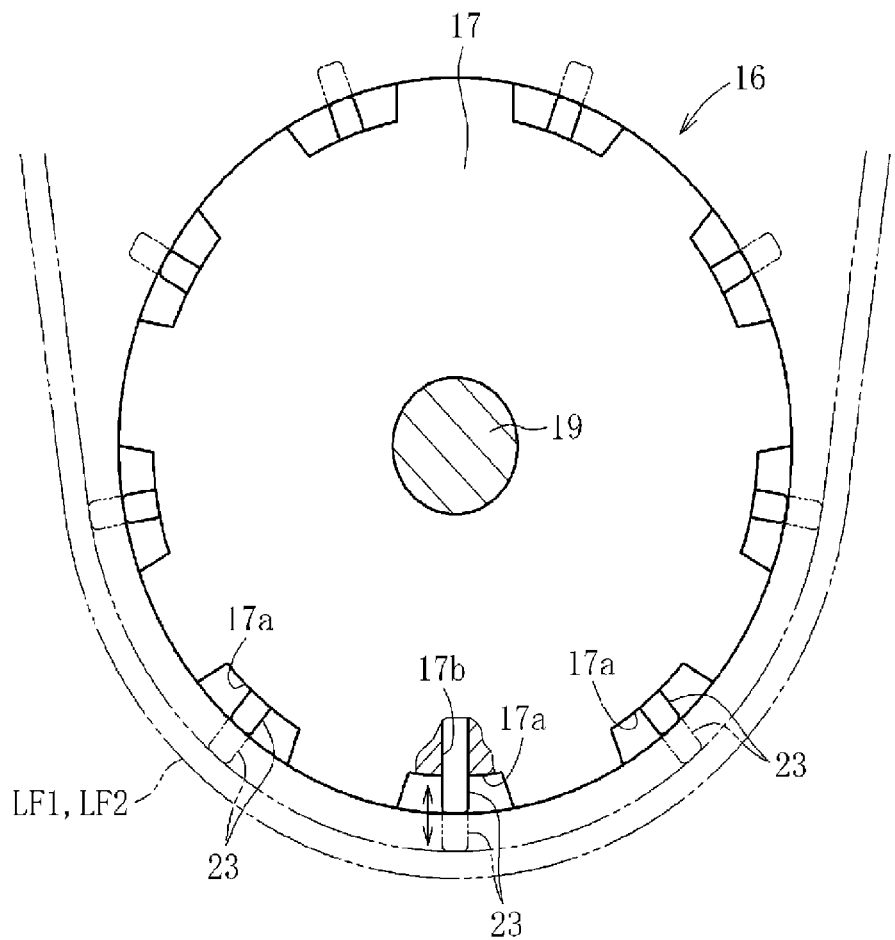
FIG. 11 is a side view of a heating roller.
Figure 12:
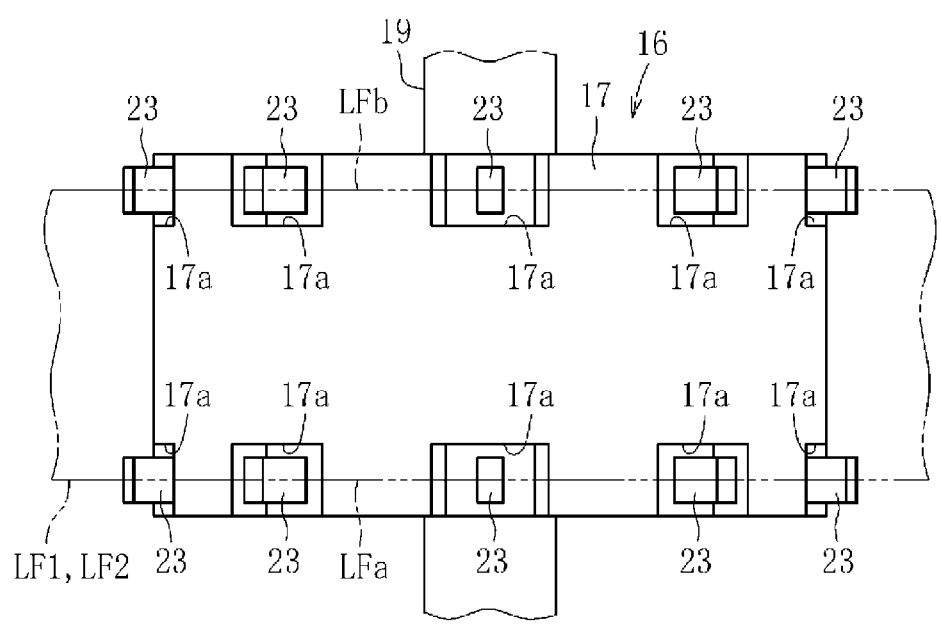
FIG. 12 is a bottom view of the heating roller.

As illustrated in FIGS. 10 to 12, the heating roller 16 of the film formation device 4 includes the roller main body 17 and a plurality of separation members 23 that separate the lead films LF1, LF2 from the roller main body 17.

The roller main body 17 includes a plurality of recessed portions 17a that accommodate the separation members 23. As illustrated in FIG. 11, a hole 17b through which the separation member 23 is inserted is formed in the recessed portion 17a. As illustrated in FIG. 12, the recessed portion 17a is formed at an end portion of the roller main body 17 in a width direction.

The roller main body 17 includes a heater inside the roller main body 17. The heater can heat an outer circumferential surface of the roller main body 17 that comes into contact with the first glass film GF1.

The separation member 23 is configured in a plate shape or a rod shape. The separation member 23 is configured to be retractable by an actuator built into the roller main body 17. The separation member 23 can, by the control of the control device 5, be changed in position between a first position (lead film support position) of protruding further outward in a radial direction of the roller main body 17 than the outer circumferential surface of the roller main body 17, and a second position (standby position) of being retracted from the first position and accommodated in the recessed portion 17a. As illustrated in FIG. 12, the separation members 23 are disposed so as to come into contact with end portions LFa, LFb of the lead films LF1, LF2 in the width direction.

The other configurations of this embodiment are the same as those of the first embodiment. In this embodiment, components common to those of the first embodiment are denoted by the same reference numerals as those of the first embodiment.

Hereafter, a manufacturing method of the glass roll GR2 according to this embodiment will be described.

As illustrated in FIG. 10, in the start preparation step S1, the control device 5 places the second transport roller 8b and the third transport roller 8c in the first position (lead film transport position), and places the separation members 23 of the heating roller 16 in the first position (lead film support position).

In the start preparation step S1, the control device 5 controls the unwinding device 6, the transport rollers 8a to 8d, and the winding device 7, and starts transport of the first lead film LF1. The control device 5 heats the roller main body 17 by the heater while rotating the roller main body 17 (temperature increase step).

Upon reaching the heating roller 16, the first coupling portion 11 and the first lead film LF1 transported by the transport device 3 come into contact with the separation members 23. End portions of the separation members 23 separate the first lead film LF1 from the outer circumferential surface of the roller main body 17 while supporting the first lead film LF1.

With the rotation of the heating roller 16 (roller main body 17), the first lead film LF1 is transported downstream of the heating roller 16 in a state of being in contact with the plurality of separation members 23 and without coming into contact with the outer circumferential surface of the roller main body 17.

When the start preparation step S1 progresses and the first coupling portion 11 is detected by the first sensor 9, the control device 5 determines whether or not the heating roller 16 has reached the film formation temperature, similarly to the first embodiment. In a case in which the heating roller 16 has reached the film formation temperature, the control device 5 ends the start preparation step S1, and executes the next film formation step S2.

Figure 13:
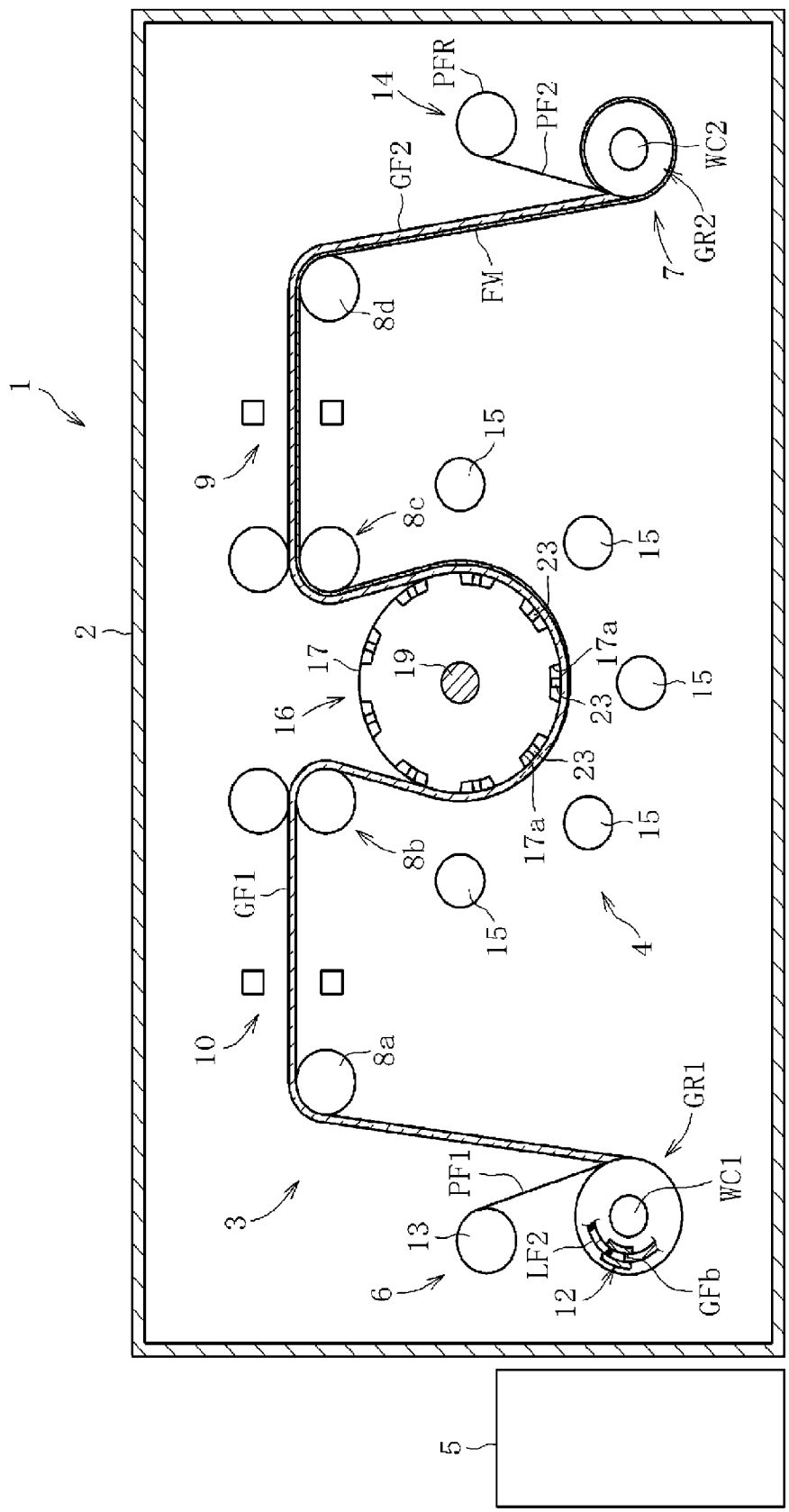
FIG. 13 is a cross-sectional view illustrating one step of a manufacturing method of a glass roll.

As illustrated in FIG. 13, the control device 5 moves the separation members 23 in the first position to the second position. As a result, the separation members 23 are accommodated in the recessed portions 17a of the roller main body 17.

Subsequently, similarly to the first embodiment, the film formation device 4 forms the functional film FM on the first glass film GF1 while heating the first glass film GF1 by the roller main body 17. In this case, the separation members 23 accommodated in the recessed portions 17a of the roller main body 17 do not come into contact with the first glass film GF1.

In the end preparation step S3, the control device 5 moves the separation members 23 in standby in the second position to the first position, and starts the temperature decrease step. The second coupling portion 12 and the second lead film LF2 that have reached the heating roller 16 are transported downstream in a state of being separated from the roller main body 17 by the separation members 23.

According to the manufacturing method and the manufacturing device 1 for the glass roll GR2 according to this embodiment described above, in the start preparation step S1 and the end preparation step S3, the lead films LF1, LF2 are separated from the roller main body 17 by the separation members 23 of the heating roller 16, thereby making it possible to cause the lead films LF1, LF2 to bypass and not be brought into contact with the roller main body 17. With this bypass path, the lead films LF1, LF2 can be transported without alteration or melt. Accordingly, the functional film FM can be formed on the first glass film GF1 without causing deformation or breakage of the lead films LF1, LF2.

Similarly, each of the coupling portions 11, 12 is separated from the roller main body 17 by the bypass path, making it possible to transport each of the coupling portions 11, 12 without causing alteration or melt of the coupling member such as adhesive tape. Accordingly, the functional film FM can be formed on the first glass film GF1 without causing separation of the first glass film GF1 and the lead films LF1, LF2 at each of the coupling portions 11, 12.

Note that the present invention is not limited to the configurations of the embodiments described above, and is not limited to the actions and effects described above. Various modifications can be made to the present invention without departing from the spirit of the present invention.

In the embodiments described above, an example has been illustrated in which the second transport roller 8b and the third transport roller 8c are configured to be repositionable between the first position and the second position, but the present invention is not limited to this configuration. In the transport device 3, the second transport roller 8b and the third transport roller 8c can be installed at positions where the lead films LF1, LF2 and the glass films GF1, GF2 can be suitably transported, and the lead films LF1, LF2 and the glass films GF1, GF2 can be transported without changing those positions.

In the transport device 3, not only the second transport roller 8b and the third transport roller 8c but also the first transport roller 8a and the fourth transport roller 8d may be constituted by a pair of rollers and configured to be repositionable.

In the second embodiment and the third embodiment described above, the second transport roller 8b and the third transport roller 8c are constituted by a pair of rollers, but the present invention is not limited to this configuration. In a case in which the manufacturing device 1 includes the separation device (separation rollers 20a, 20b), each of the second transport roller 8b and the third transport roller 8c may be constituted by a single roller.

In the embodiments described above, an example has been illustrated in which, in the end preparation step S3, a temperature decrease step in which the temperature of the heating roller 16 is decreased is executed, but the present invention is not limited to this configuration. In a case in which the second lead film LF2 can be separated from the heating roller 16 until in a position where alteration or melt of the second lead film LF2 does not occur, and in a case in which the second coupling portion 12 can be separated from the heating roller 16 until in a position where alteration or melt of the coupling member such as adhesive tape used in the second coupling portion 12 does not occur, the second lead film LF2 and the second coupling portion 12 may be transported without decreasing the temperature of the heating roller 16. Further, in a case in which heat-blocking is performed by the heat-blocking plates 21, the second lead film LF2 may be transported without decreasing the temperature of the heating roller 16.

In the embodiments described above, an example has been illustrated in which the positions of the first coupling portion 11 and the second coupling portion 12 are detected by using the first sensor 9 and the second sensor 10, but the present invention is not limited to this configuration. In a case in which lengths of the first glass film GF1 and each of the lead films LF1, LF2 are identified in advance, the positions of the first coupling portion 11 and the second coupling portion 12 on the transport path can be identified from an unwound distance and a wound distance.

In the embodiments described above, the first lead film LF1 and the first coupling portion 11, when transported, are separated from the heating roller 16 and, after the first coupling portion 11 passes by the heating roller 16, the first glass film GF1 is brought into contact with the heating roller 16. However, the present invention is not limited to this embodiment. For example, in a case in which a polyimide film or the like having a high heat resistance is used as the first lead film LF1, the first lead film LF1 can be transported in a state of being in contact with the heating roller 16. In this case, the first coupling portion 11 may be separated from the heating roller 16 before or immediately after the first coupling portion 11 reaches the heating roller 16. The same applies to the second lead film LF2 and the second coupling portion 12. In addition, in a case in which the heating temperature of the heating roller 16 has not reached the predetermined temperature and thus is in a temperature range in which the first lead film LF1 does not undergo alteration, melt, or the like, the first lead film LF1 may be transported in contact with the heating roller 16 and, once the heating roller 16 reaches the predetermined temperature and thus is in a temperature range in which the first lead film LF1 may undergo alteration, melt, or the like, the first lead film LF1 may be separated from the heating roller 16.

In the third embodiment described above, an example has been illustrated in which the heat-blocking plate 21 of the heat-blocking device is configured to be movable in the axial direction of the heating roller 16 of the film formation device 4, but the present invention is not limited to this configuration. The heat-blocking plate 21 may be moved in a circumferential direction of the heating roller 16 to reposition the heat-blocking plate 21 between a first position (heat-blocking position) and a second position (standby position) above the heating roller 16.

In the third embodiment described above, a configuration in which the cooling pipe 22 is provided inside the heat-blocking plate 21 of the heat-blocking device has been illustrated as an example, but the present invention is not limited to this configuration and only the heat-blocking plate 21 may be provided without providing the cooling pipe 22.

REFERENCE SIGNS LIST

1 Manufacturing device
3 Transport device
4 Film formation device
6 Unwinding device
7 Winding device
8a First transport roller
8b Second transport roller
8c Third transport roller
8d Fourth transport roller
11 First coupling portion
12 Second coupling portion
16 Heating roller
17 Roller main body
20a First separation roller
20b Second separation roller
21 Heat-blocking plate
23 Separation member
FM Functional film
GF1 First glass film
GF2 Second glass film
GR2 Glass roll
LF1 First lead film
LF2 Second lead film

The invention claimed is:

1. A manufacturing method of a glass roll, the manufacturing method comprising:
   forming a functional film on a glass film transported by a transport device while heating the glass film in a state where the glass film is in contact with a heating roller; and
   winding the glass film on which the functional film is formed into a roll shape,
   wherein the glass film is coupled to a lead film via a coupling portion, and
   the transport device is configured to separate the lead film and/or the coupling portion from the heating roller when the lead film and/or the coupling portion pass by the heating roller.

2. The manufacturing method of a glass roll according to claim 1, wherein
   the transport device includes a transport roller configured to transport the lead film and the glass film,
   the transport roller is configured to be movable close to and away from the heating roller, and
   the transport roller is configured to separate the lead film and/or the coupling portion from the heating roller when the lead film and/or the coupling portion pass by the heating roller.

3. The manufacturing method of a glass roll according to claim 2, wherein
   the transport roller includes a pair of transport rollers configured to sandwich the lead film.

4. The manufacturing method of a glass roll according to claim 1, wherein
   the transport device includes a separation member configured to separate the lead film and/or the coupling portion from the heating roller when the lead film and/or the coupling portion pass by the heating roller.

5. The manufacturing method of a glass roll according to claim 4, wherein the separation member is a roller.

6. The manufacturing method of a glass roll according to claim 1, wherein
   the transport device includes a heat-blocking member configured to be interposed between the heating roller and the lead film and/or the coupling portion.

7. A manufacturing device for a glass roll, the manufacturing device comprising:
   a transport device configured to transport a glass film coupled to a lead film via a coupling portion; and
   a heating film formation device configured to form a functional film on the glass film,
   wherein the heating film formation device includes a heating roller configured to come into contact with and heat the glass film, and
   the transport device includes
   an unwinding device configured to feed out the glass film,
   a winding device configured to wind the glass film on which the functional film is formed into a roll shape,
   a transport roller disposed between the unwinding device and the winding device and configured to transport the glass film, and
   a separation member configured to separate the lead film and/or the coupling portion from the heating roller when the lead film and/or the coupling portion pass by the heating roller.

8. A manufacturing method of a glass roll, the manufacturing method comprising:
   forming a functional film on a glass film transported by a transport device while heating the glass film in a state where the glass film is in contact with a heating roller; and
   winding the glass film on which the functional film is formed into a roll shape,
   wherein the glass film is coupled to a lead film via a coupling portion, and
   the heating roller includes
   a roller main body configured to come into contact with and heat the glass film, and
   a separation member configured to separate the lead film and/or the coupling portion from the roller main body when the lead film and/or the coupling portion pass by the roller main body.

9. A manufacturing device for a glass roll, the manufacturing device comprising:
   a transport device configured to transport a glass film coupled to a lead film via a coupling portion; and a heating film formation device configured to form a functional film on the glass film,
wherein the heating film formation device includes a heating roller configured to come into contact with and heat the glass film, and
the heating roller includes
a roller main body configured to come into contact with and heat the glass film, and a separation member configured to separate the lead film and/or the coupling portion from the roller main body when the lead film and/or the coupling portion pass by the roller main body.

* * * * *